United States Patent
Toh et al.

(10) Patent No.: US 8,698,118 B2
(45) Date of Patent: Apr. 15, 2014

(54) COMPACT RRAM DEVICE AND METHODS OF MAKING SAME

(75) Inventors: Eng Huat Toh, Singapore (SG); Elgin Quek, Singapore (SG); Shyue Seng Tan, Singapore (SG)

(73) Assignee: GLOBALFOUNDRIES Singapore Pte Ltd, Singapore (SG)

( * ) Notice: Subject to any disclaimer, the term of this patent is extended or adjusted under 35 U.S.C. 154(b) by 9 days.

(21) Appl. No.: 13/408,221

(22) Filed: Feb. 29, 2012

(65) Prior Publication Data

US 2013/0221308 A1   Aug. 29, 2013

(51) Int. Cl.
H01L 29/02   (2006.01)
H01L 47/00   (2006.01)
H01L 29/04   (2006.01)
H01L 29/06   (2006.01)

(52) U.S. Cl.
USPC ............... 257/2; 257/3; 257/4; 257/5; 257/6

(58) Field of Classification Search
USPC ........................ 257/324, 326, 1–6
See application file for complete search history.

(56) References Cited

U.S. PATENT DOCUMENTS

| | | | |
|---|---|---|---|
| 4,507,159 A | 3/1985 | Erb | |
| 5,173,760 A | 12/1992 | Min et al. | |
| 5,332,682 A | 7/1994 | Lowrey | |
| 5,973,381 A | 10/1999 | Kudo et al. | |
| 6,403,482 B1 | 6/2002 | Rovedo et al. | |
| 6,531,371 B2 | 3/2003 | Hsu et al. | 438/385 |
| 6,642,607 B2 | 11/2003 | Ohnishi et al. | |
| 6,867,996 B2 | 3/2005 | Campbell et al. | 365/100 |
| 6,870,755 B2 | 3/2005 | Rinerson et al. | 365/148 |
| 6,946,702 B2 | 9/2005 | Jang | 257/306 |
| 7,067,865 B2 | 6/2006 | Lung | 257/296 |
| 7,149,108 B2 * | 12/2006 | Rinerson et al. | 365/163 |
| 7,157,750 B2 | 1/2007 | Bulovic et al. | 257/200 |
| 7,238,984 B2 * | 7/2007 | Shibata et al. | 257/324 |
| 7,292,469 B2 | 11/2007 | Lee et al. | 365/163 |
| 7,569,844 B2 | 8/2009 | Lung | |
| 7,606,055 B2 | 10/2009 | Liu | |
| 7,786,461 B2 | 8/2010 | Lung | |
| 7,875,493 B2 | 1/2011 | Lung | |
| 7,956,344 B2 | 6/2011 | Lung | |
| 8,115,586 B2 | 2/2012 | Hosoi et al. | |
| 8,174,865 B2 | 5/2012 | Rhie et al. | |
| 8,183,126 B2 | 5/2012 | Lee et al. | |
| 8,304,841 B2 | 11/2012 | Xu et al. | |
| 2002/0017657 A1 | 2/2002 | Coffa et al. | |
| 2002/0192881 A1 | 12/2002 | Ballantine et al. | |
| 2003/0017639 A1 | 1/2003 | Ballantine et al. | |
| 2007/0066014 A1 | 3/2007 | Park et al. | |
| 2009/0103355 A1 * | 4/2009 | Saitou | 365/184 |
| 2010/0237404 A1 * | 9/2010 | Toba et al. | 257/326 |
| 2012/0074374 A1 | 3/2012 | Jo | |

OTHER PUBLICATIONS

Deng et al., "Salicidation process using NiSi and its device application," *J. Appl. Phys.*, 81:8047-51, 1997.

(Continued)

*Primary Examiner* — Steven Loke
*Assistant Examiner* — Juanita B Rhodes
(74) *Attorney, Agent, or Firm* — Amerson Law Firm, PLLC

(57) ABSTRACT

Disclosed herein is a compact RRAM (Resistance Random Access Memory) device structure and various methods of making such an RRAM device. In one example, a device disclosed herein includes a gate electrode, a conductive sidewall spacer and at least one variable resistance material layer positioned between the gate electrode and the conductive sidewall spacer.

23 Claims, 7 Drawing Sheets

(56) References Cited

OTHER PUBLICATIONS

Gambino and Colgan, "Silicides and ohmic contacts," *Materials Chemistry and Physics*, 52:99-146, 1998.
Koshida et al., "Field-induced functions of porous Si as a confined system," *J. of Luminescence*, 80:37-42, 1999.
Liu et al., "Observation of Switching Behaviors in Post-Breakdown Conductions in NiSi-gated Stacks," IEDM09:135-138, 2009.
Ma et al., "Nonvolatile electrical bistability of organic/metal-nanocluster/organic system," *Applied Physics Letters*, 82:1419-21, 2003.
Raghavan et al., "Unipolar recovery of dielectric breakdown in fully silicided high-k gate stack devices and its reliability implications," *Applied Physics Letters*, 96:142901, 2010.
Rozenberg et al., "Nonvolatile Memory with Multilevel Switching: A Basic Model," *Physical Review Letters*, 92:178302, 2004.
Sakamoto et al., "Nanometer-scale switches using copper sulfide," *Applied Physics Letters*, 82:3032-34, 2003.
Terabe et al., "Ionic/electronic mixed conductor tip of a scanning tunneling microscope as a metal atom source for nanostructuring," *Applied Physics Letters*, 80:4009-11, 2002.
Chindalore et al., "Embedded Split-Gate Flash Memory with Silicon Nanocrystals for 90nm and Beyond," *2008 Symposium on VLSI Technology Digest of Technical Papers*, pp. 136-137, 2008.
Chiu et al., "A Low Store Energy, Low VDDmin, Nonvolatile 8T2R SRAM with 3D Stacked RRAM Devices for Low Power Mobile Applications," *2010 Symposium on VLSI Circuits/Technical Digest of Technical Papers*, pp. 229-230, 2010.
Kuegeler et al., "Materials, technologies, and circuit concepts for nanocrossbar-based bipolar RRAM," *Appl. Phys. A*, 102:791-809, 2011.
Lee et al., "2-stack 1D-1R Cross-point Structure with Oxide Diodes as Switch Elements for High Density Resistance RAM Applications," *2007 IEEE*, pp. 771-774, 2007.
Russo et al., "Filament Conduction and Reset Mechanism in NiO-Based Resistive-Switching Memory (RRAM) Devices," *IEEE Transactions on Electron Devices*, 56:186-192, 2009.
Sekar, "IEEE SCV EDS Technical Events, Nov. 16, 2010, Resistive RAM: Technology and Market Opportunities" Presentation, 2010.
Shimizu et al., "A Novel High-Density $5F^2$ NAND STI Cell Technology Suitable for 256Mbt and 1Gbit Flash Memories," *1997 IEEE*, pp. 97-271-97-274, 1997.
Tseng et al., "High Density and Ultra Small Cell Size of Conctact ReRAM (CR-RAM) in 90nm CMOS Logic Technology and Circuits," *2009 IEEE*, pp. 09-109-09-112, 2009.
Tsunoda et al., "Low Power and High Speed Switching of Ti-doped NiO ReRAM under the Unipolar Voltage Source of less than 3 V," *2007 IEEE*, pp. 767-770, 2007.
Wei et al., "Highly Reliable $TaO_x$ ReRAM and Direct Evidence of Redox Reaction Mechanism," *2008 IEEE*, pp. 293-296, 2008.
Whang et al., "Novel 3-Dimensional Dual Control-Gate with Surrounding Floating-Gate (DC-SF) $\overline{NAND}$ $\overline{Flash}$ Cell for 1Tb File $\overline{Storage}$ $\overline{Application}$," *2010 IEEE*, pp. 10-668-10-671, 2010.

* cited by examiner

COMPACT RRAM DEVICE AND METHODS OF MAKING SAME

BACKGROUND OF THE INVENTION

1. Field of the Invention

Generally, the present disclosure generally relates to the manufacturing of sophisticated semiconductor devices, and, more specifically, to a compact RRAM (Resistance Random Access Memory) device structure and various methods of making such an RRAM device.

2. Description of the Related Art

As is well known non-volatile memory devices are characterized in that there is no loss of data stored in their memory cells, even when an external power supply is removed. For that reason, such non-volatile memory devices are widely employed in a computer, a mobile communication system, a memory card, and the like.

Flash memory structures are widely used in such non-volatile memory applications. The typical flash memory device employs memory cells having a stacked gate structure. The stacked gate structure typically includes a tunnel oxide layer, a floating gate, an inter-gate dielectric layer, and a control gate electrode, which are sequentially stacked above a channel region. While flash memory structures have enjoyed enormous success, the continued and ever-present drive to reduce the size of integrated circuit products has created many challenges for the continued scaling of flash memory devices. Such challenges include scaling of program/erase voltages, access speed, reliability, the number of charges stored per floating gate, etc.

A resistance random access memory (RRAM) device is a memory device in which a variable resistance material layer is used as a data storage material layer. The resistance of the variable resistance material layer may be varied or changed based upon the polarity and/or amplitude of an applied electric pulse. The electric field strength or electric current density from the pulse, or pulses, is sufficient to switch the physical state of the materials so as to modify the properties of the material. The pulse is of low enough energy so as not to destroy, or significantly damage, the material. Multiple pulses may be applied to the material to produce incremental changes in properties of the material. One of the properties that can be changed is the resistance of the material. The change may be at least partially reversible using pulses of opposite polarity or pulses having a different amplitude from those used to induce the initial change.

The variable resistance material layer employed in an RRAM device may be comprised of a material capable of having its resistivity changed in response to an electrical signal. Such materials may include a perovskite material, such as a colossal magnetoresistive (CMR) material or a high temperature superconducting (HTSC) material, for example $Pr_{0.7}Ca_{0.3}MnO_3$ (PCMO). Another example of a suitable material is $Gd_{0.7}CaO_{0.3}BaCo_2O_{5+5}$. Other possible materials for the variable resistance layer include transition metal oxides such as hafnium oxide, titanium oxide, nickel oxide, tungsten oxide, tantalum oxide, copper oxide, etc., manganites, titanates (e.g., STO:Cr), zirconates (e.g., SZO:Cr, $Ca_2Nb_2O_7$:Cr, $Ta_2O_5$:Cr), and high Tc superconductors (e.g., YBCO). RRAM devices may be advantageous in highly scaled, high integration applications due to their relatively smaller foot print as compared to a capacitor based memory device in which memory characteristics are proportional to the size of a cell area.

The present disclosure is directed to a novel a compact RRAM (Resistance Random Access Memory) device structure and various methods of making such an RRAM device.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to a compact RRAM (Resistance Random Access Memory) device structure and various methods of making such an RRAM device. In one example, a device disclosed herein includes a gate electrode, a conductive sidewall spacer and at least one variable resistance material layer positioned between the gate electrode and the conductive sidewall spacer.

In another example, a device disclosed herein includes a gate electrode, a conductive sidewall spacer and at least one variable resistance material layer wherein at least a first portion of the at least one variable resistance material layer is positioned between the gate electrode and the conductive sidewall spacer, and wherein a second portion of the at least one variable resistance material layer is formed on a surface of a semiconducting substrate. In this example, the second portion of the at least one variable resistance material layer is positioned between the substrate and a bottom of the conductive sidewall spacer.

In yet another illustrative example, a RRAM device disclosed herein includes a first unit cell and a second unit cell formed in and above a semiconducting substrate, wherein each of the unit cells comprises a gate electrode, a conductive sidewall spacer and at least one variable resistance material layer positioned between the gate electrode and the conductive sidewall spacer. The device further includes an isolation structure positioned at least partially in the substrate, wherein the isolation structure electrically isolates the first and second unit cells.

Another illustrative RRAM device disclosed herein includes a gate electrode, a sidewall spacer comprised of a variable resistance material and at least one conductive contact conductively coupled to the sidewall spacer.

Yet another illustrative RRAM device disclosed herein includes a first unit cell and a second unit cell formed in and above a semiconducting substrate, wherein each of the unit cells comprises a gate electrode, a sidewall spacer comprised of a variable resistance material and at least one conductive contact conductively coupled to the sidewall spacer. This illustrative device further includes an isolation structure positioned at least partially in the substrate, wherein the isolation structure electrically isolates the first and second unit cells.

BRIEF DESCRIPTION OF THE DRAWINGS

The disclosure may be understood by reference to the following description taken in conjunction with the accompanying drawings, in which like reference numerals identify like elements, and in which.

Figure 1A:
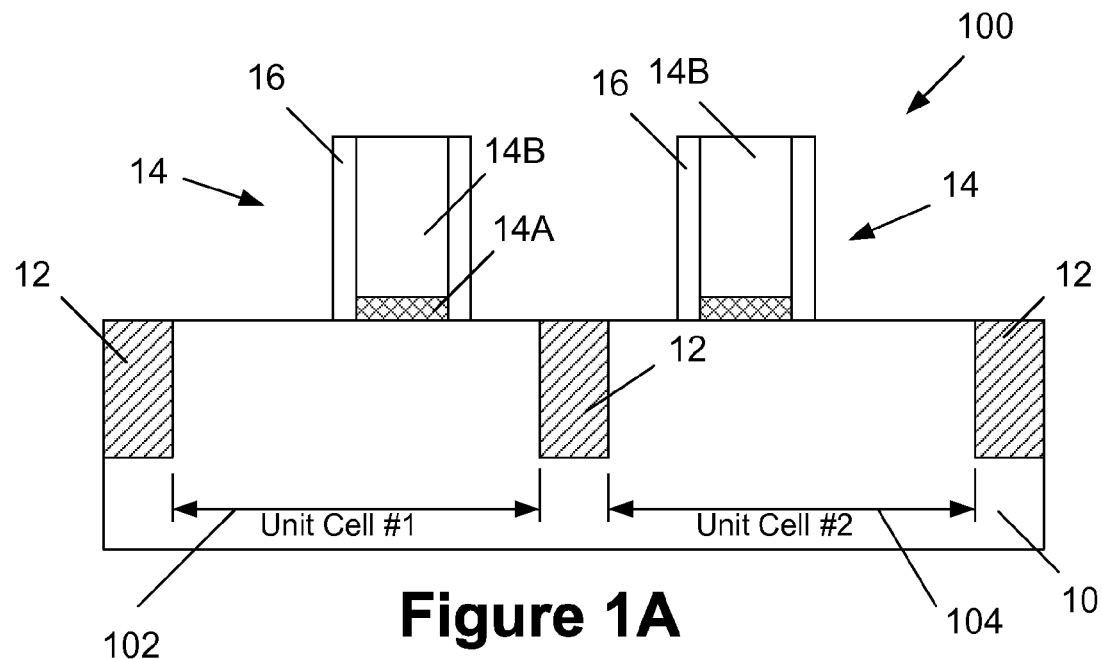
FIGS. 1A-1F depict one illustrative process flow for forming the novel RRAM device disclosed.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to a compact RRAM (Resistance Random Access Memory) device structure and various methods of making such an RRAM device. As will be readily apparent to those skilled in the art upon a complete reading of the present application, the device disclosed herein may be employed with a variety of technologies, e.g., NMOS, PMOS, CMOS, etc., and it may be incorporated into a variety of devices. With reference to the attached drawings, various illustrative embodiments of the methods and devices disclosed herein will now be described in more detail.

FIG. 1A is a simplified view of an illustrative RRAM device 100 at an early stage of manufacturing. The RRAM device 100 is formed above a semiconducting substrate 10. The illustrative RRAM device 100 when completed will be comprised of two illustrative unit cells 102, 104. Each of the unit cells 102, 104 are formed in and above active regions that are defined by illustrative trench isolation structures 12 formed in the substrate 10. The substrate 10 may have a variety of configurations, such the depicted bulk silicon configuration. The substrate 10 may also have a silicon-on-insulator (SOI) configuration that includes a bulk silicon layer, a buried insulation layer and an active layer, wherein semiconductor devices are formed in and above the active layer. Thus, the terms substrate or semiconductor substrate should be understood to cover all semiconductor structures. The substrate 10 may also be made of materials other than silicon.

At the point of fabrication depicted in FIG. 1A, each of unit cells 102, 104 includes A schematically depicted gate electrode structure 14 that typically includes an illustrative gate insulation layer 14A and an illustrative gate electrode 14B. The gate insulation layer 14A may be comprised of a variety of different materials, such as, for example, silicon dioxide, a so-called high-k (k greater than 10) insulation material, etc. Similarly, the gate electrode 14B may also be of a material such as polysilicon or amorphous silicon, or it may be comprised of one or more metal layers that act as the gate electrode 14B. As will be recognized by those skilled in the art after a complete reading of the present application, the gate electrode structure 14 of the RRAM device 100 depicted in the drawings, i.e., the gate insulation layer 14A and the gate electrode 14B, is intended to be representative in nature. That is, the gate electrode structures 14 may be comprised of a variety of different materials and may they have a variety of configurations, and the gate electrode structures 14 may be made using either so-called "gate-first" or "gate-last" techniques. Also as depicted in FIG. 1A, is an illustrative sidewall spacer or liner layer 16 that is formed adjacent each of the gate structures 14. The various components and structures of the RRAM device 100 may be formed using a variety of different materials and by performing a variety of known techniques. For example, the sidewall spacers or liner layers 16 may be comprised of silicon dioxide, and they may be formed by depositing a layer of spacer material and thereafter performing an anisotropic etching process.

Figure 1B:
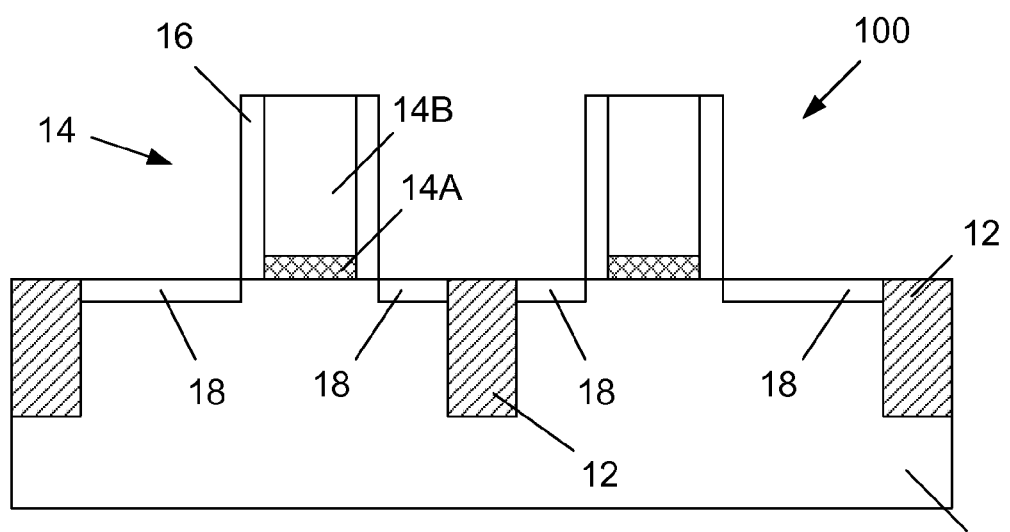

Next, as shown in FIG. 1B, an ion implantation process is performed to form implant regions 18 in the substrate 10. The implant regions 18 may be comprised of implanted dopant materials (N-type dopants for an NMOS based RRAM device and P-type dopant for PMOS based RRAM device that are implanted into the substrate 10 using known masking and ion implantation techniques. In one illustrative embodiment, the implant regions 18 may be doped with a dopant dose and energy level that is consistent with a typical extension implant process used in manufacturing basic transistors. In another illustrative embodiment, the implant regions 18 may be doped with a dopant dose and an energy level that is consistent with a typical source/drain implant process (typically a higher dopant dose and energy level than that employed in an extension implant process) used in manufacturing basic transistors. In the depicted embodiment, the gate structures 14 of the each of the unit cells is not positioned in the middle of the respective active regions so as to conserve plot space and produce a compact device.

Figure 1C:
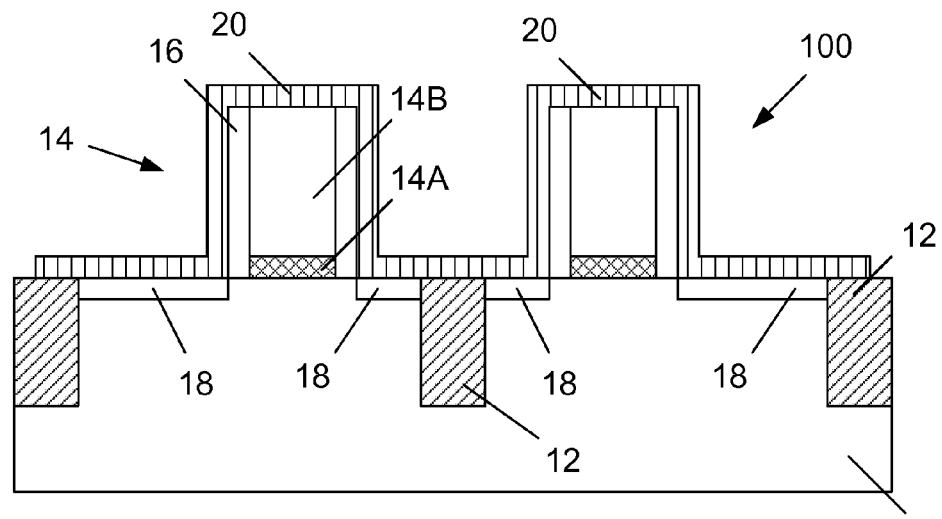

FIG. 1C depicts the RRAM device 100 after one or more layers 20 of variable resistance material are formed about the RRAM device 100. The variable resistance material layer 20 may be comprised of may be comprised of a material capable of having its resistivity changed in response to an electrical signal. The variable resistance material layer 20 may be formed by performing a variety of conformable deposition processes, such as a chemical vapor deposition (CVD) process, an atomic layer deposition (ALD) process, or plasma-enhanced versions of those processes, etc. In one illustrative embodiment, the variable resistance material layer 20 has a generally L-shaped configuration and it may have a thickness that ranges from about 5-20 nm depending upon the particular application. A first portion (the vertically oriented portion) of the variable resistance material layer 20 is positioned between the gate electrode 14B and the conductive sidewall spacer 22, while a second portion (the horizontally oriented portion) of the variable resistance material layer 20 is formed above the surface of the substrate and separates the bottom of the conductive sidewall spacer 22 from the substrate 10. The variable resistance material layer 20 may be comprised of at least one of the following illustrative materials: a perovskite material, such as a colossal magnetoresistive (CMR) material or a high temperature superconducting (HTSC) material, for example $Pr_{0.7} Ca_{0.3} MnO_3$ (PCMO),s $Gd_{0.7} CaO_{0.3} BaCo_2 O_{5+\delta}$, a transition metal oxide such as hafnium oxide, titanium oxide, nickel oxide, tungsten oxide, tantalum oxide, copper oxide, etc., manganites, titanates (e.g., STO:Cr), zirconates (e.g., SZO:Cr, $Ca_2 Nb_2 O_7$:Cr, $Ta_2 O_5$:Cr), and high Tc superconductors (e.g., YBCO), etc.

Figure 1D:
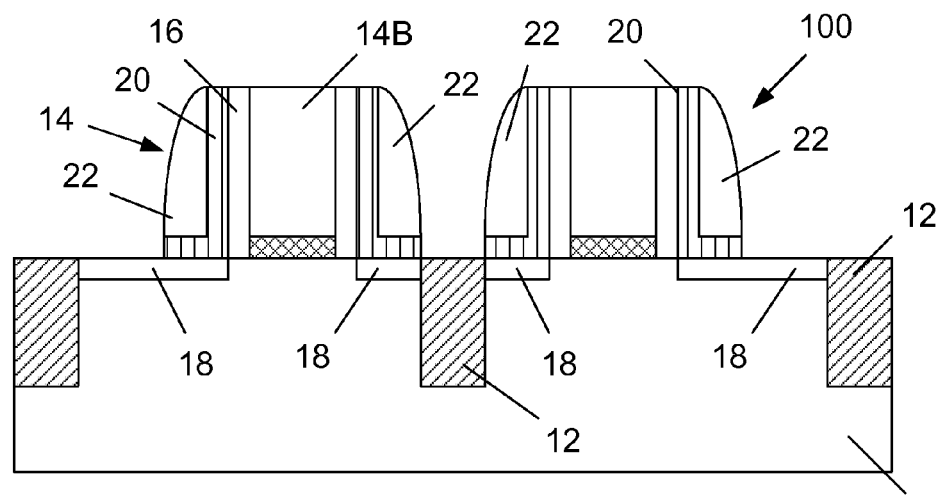

FIG. 1D depicts the illustrative RRAM device 100 after several process operations have been performed. First, a plurality of conductive electrode spacers 22 are formed proximate the gate structures 14. The conductive electrode spacers 22 may be comprised of a variety of materials such as a metal, like titanium, tantalum, titanium nitride, tantalum nitride, tungsten, platinum, ruthenium, etc., and the conductive electrode spacers 22 may be formed by depositing a layer of the conductive electrode spacers material and thereafter performing an anisotropic etching process. Then, an etching process is performed to remove exposed portions of variable resistance material layer 20.

Figure 1E:
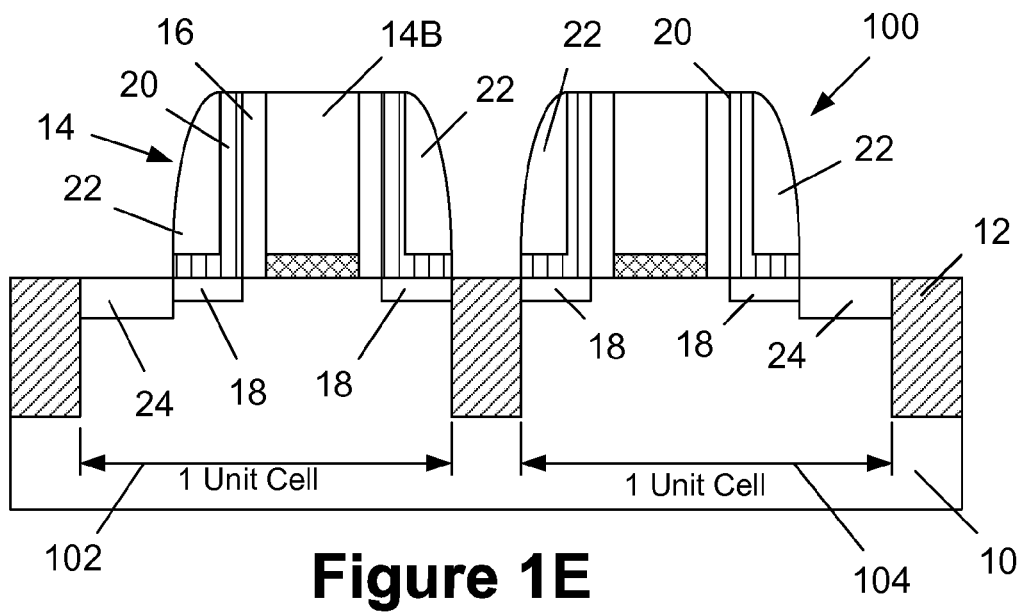
Figure 1F:
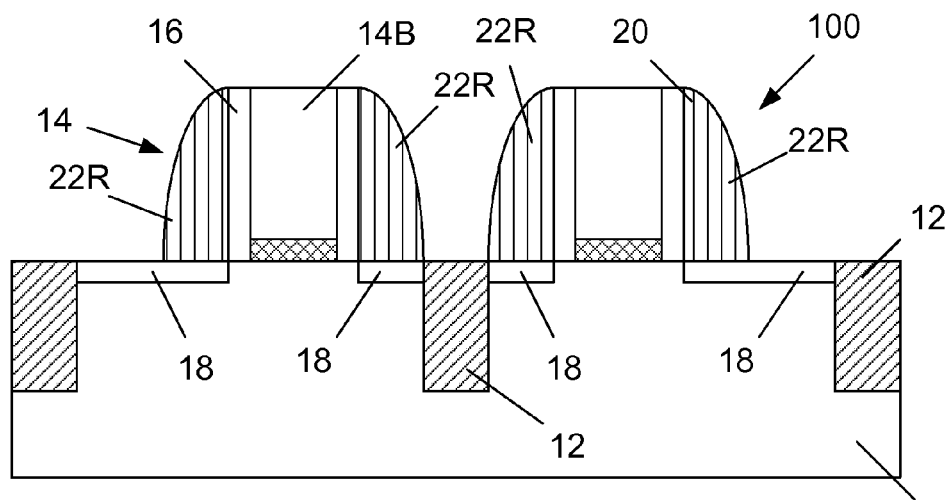

As shown in FIG. 1F, in one specific example, the spacers may also be comprised of the same variable resistance material as set forth above for the variable resistance material layer 20. Such a variable resistance spacer 22R may be made by depositing a layer of the Variable resistance material of the appropriate thickness and thereafter performing an anisotropic etching process. In one illustrative embodiment, the spacer 22R may have a base thickness that may be between about 10-30 nm, depending on the particular application. In some cases the liner layer 16 may be omitted such that the substantially vertical portion of the spacer 22R contacts the gate electrode 14B while the substantially horizontal portion of the spacer 22R contacts the substrate 10. In this embodiment, the conductive contact(s) that is conductively coupled to the variable resistance spacer 22R, like the spacer electrode contact 32 depicted in FIG. 2B below, would serve as the gate electrode.

Next, as shown in FIG. 1E, an ion implantation process is performed to form source/drain implant regions 24 in the substrate 10. The source/drain implant regions 24 may be comprised of implanted dopant materials (N-type dopants for an NMOS based RRAM device and P-type dopant for PMOS based RRAM device that are implanted into the substrate 10 using known masking and ion implantation techniques. Consistent with standard practice, the source/drain implant regions 24 typically have a higher concentration of dopant material than do the implant regions 18. However, as noted earlier, if desired or needed for a particular application, the implant regions 18 could be relatively lightly doped extension implant regions or relatively heavily doped source/drain implant regions. For discussion purposes, the implant regions 18, 24 are depicted in there as-implanted positions. In a real-world device, one or more anneal processes would be performed to activate the implanted dopant material and to repair any damage to the lattice structure of the substrate 10 caused by the ion implant processes. The aforementioned process steps result in the definition of the two illustrative unit cells 102, 104 as shown in FIG. 1E.

Figure 2A:
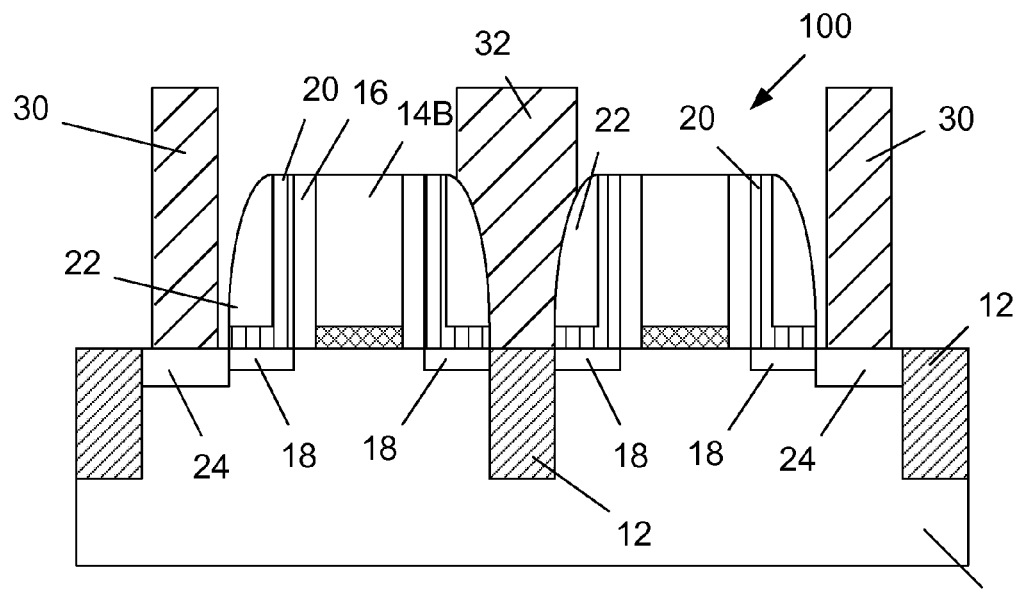
FIGS. 2A-2B depict one illustrative technique of forming conductive contacts for the novel RRAM device disclosed herein.
Figure 2B:
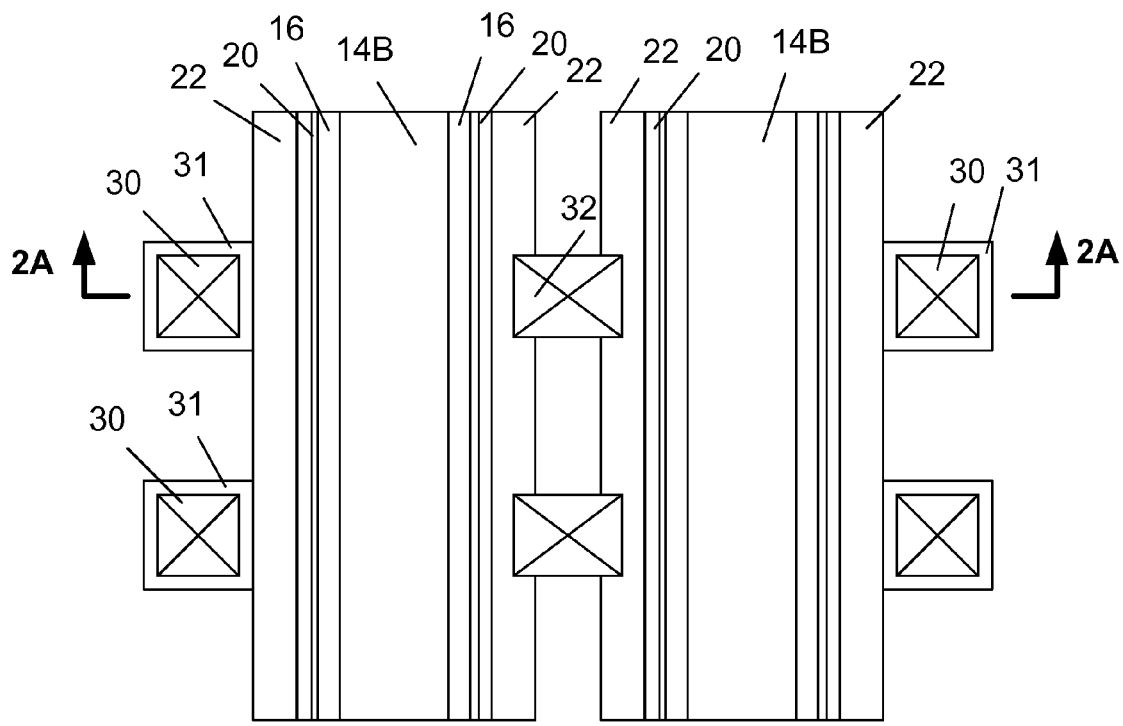

There are various illustrative techniques for forming conductive contacts or structures to the unit cells 102, 104. FIGS. 2A and 2B are, respectively, a cross-sectional view and a plan view of the RRAM device 100 that depicts one such illustrative technique. As shown therein, a plurality of conductive source-line contacts 30 are conductively coupled the source region 31 (a combination of the implant regions 24 and 18) to each of the unit cells 102, 104. A plurality of illustrative spacer electrode contacts 32 are conductively coupled to the conductive electrode spacers 22. The contacts 30, 32 may be of any desired size of configuration, they may be comprised of any of a variety of different conductive materials such as a metal, aluminum, titanium, etc., and they may be formed using a variety of known techniques.

Figure 3C:
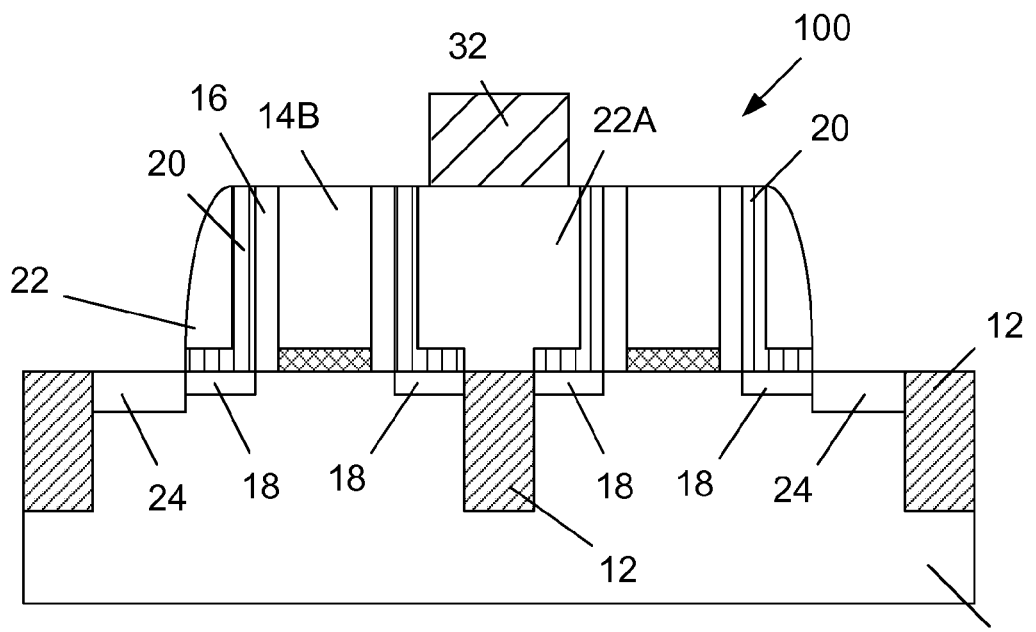
FIGS. 3A-3C depict another illustrative technique of forming conductive contacts for the novel RRAM device disclosed herein.
Figure 3A:
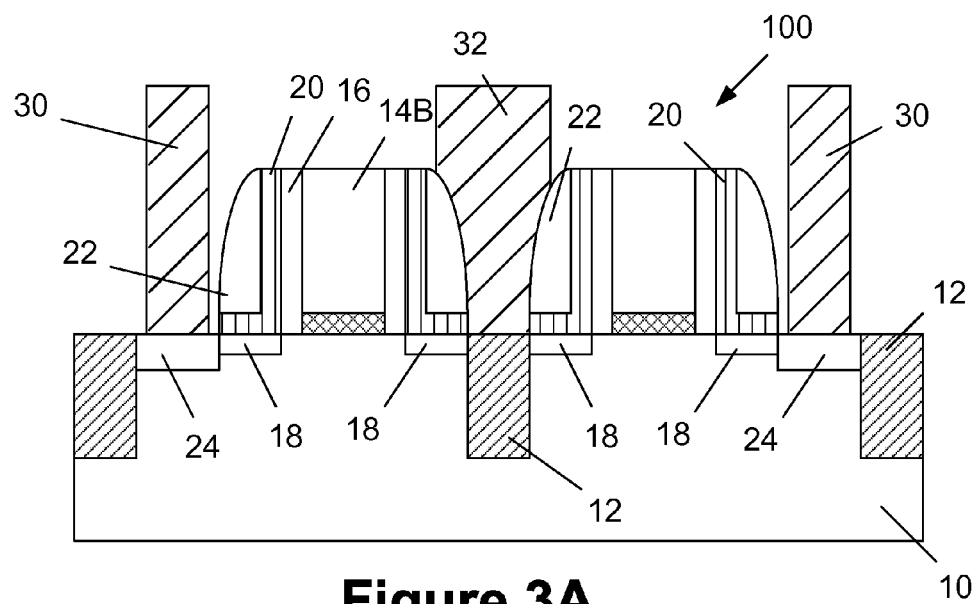
Figure 3B:
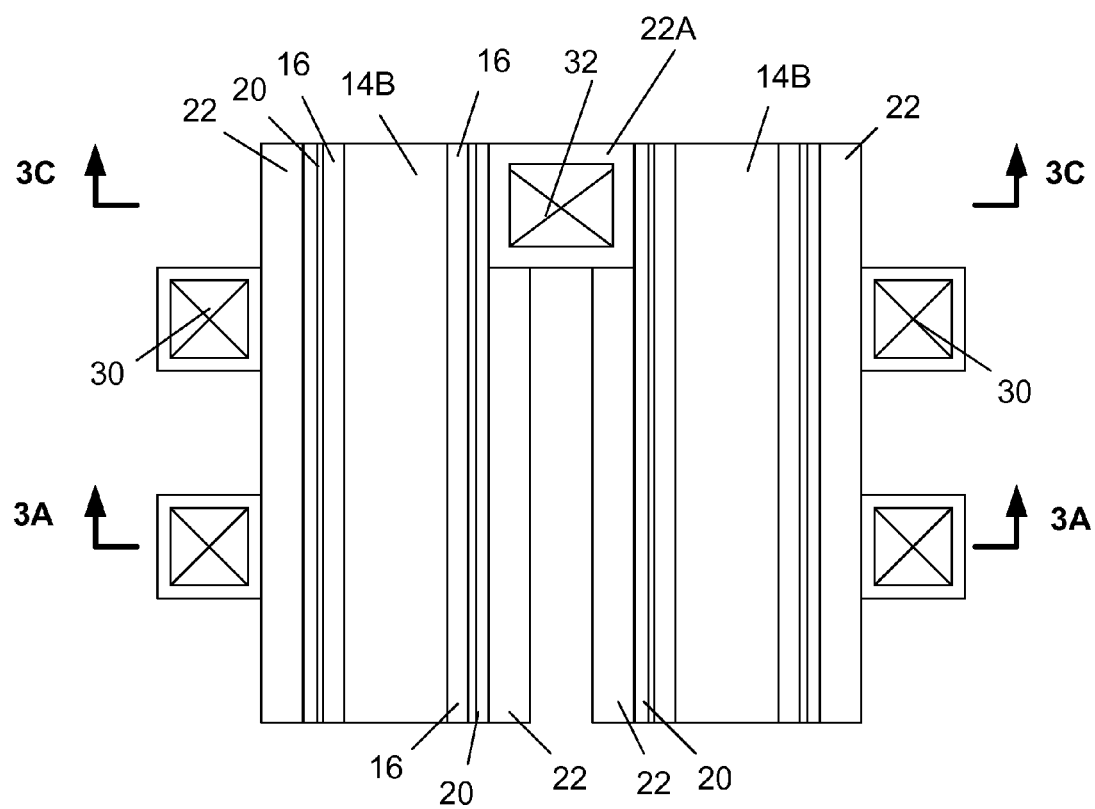

FIGS. 3A-3C depict another illustrative technique for forming conductive contacts or structures to the unit cells 102, 104. FIG. 3B is a plan view of this illustrative embodiment of the RRAM device 100, while FIGS. 3A and 3B are cross-sectionals views taken as indicated in FIG. 3B. As shown in FIGS. 3A-3B, the RRAM device 100 comprises a plurality of conductive source-line contacts 30 are conductively coupled the source region 31 (a combination of the implant regions 24 and 18) to each of the unit cells 102, 104. A plurality of illustrative spacer electrode contacts 32 are conductively coupled to the conductive electrode spacers 22. In this illustrative embodiment, as shown in FIGS. 3B-3C, an etch mask (not shown) is used during the formation of the conductive electrode spacers 22 such that a contact regions 22A comprised of a merged region of spacer material is proximate an end of the device 100. In this embodiment, an illustrative spacer electrode contact 32 is conductively coupled to the contact regions 22A.

Figure 4A:
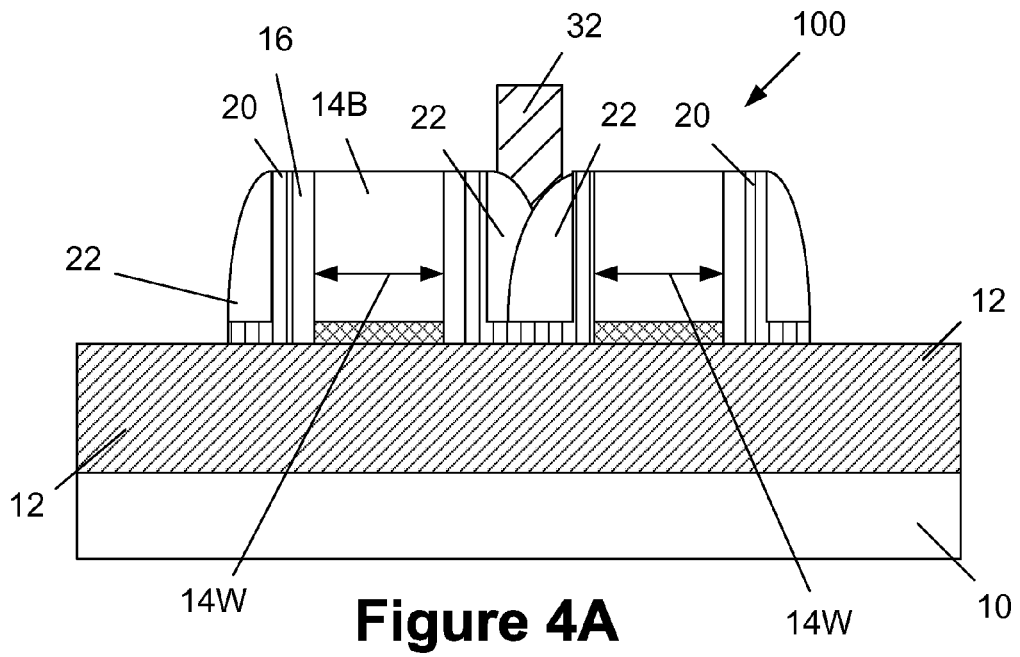
FIGS. 4A-4B depict yet another illustrative technique of forming conductive contacts for the novel RRAM device disclosed herein.
Figure 4B:
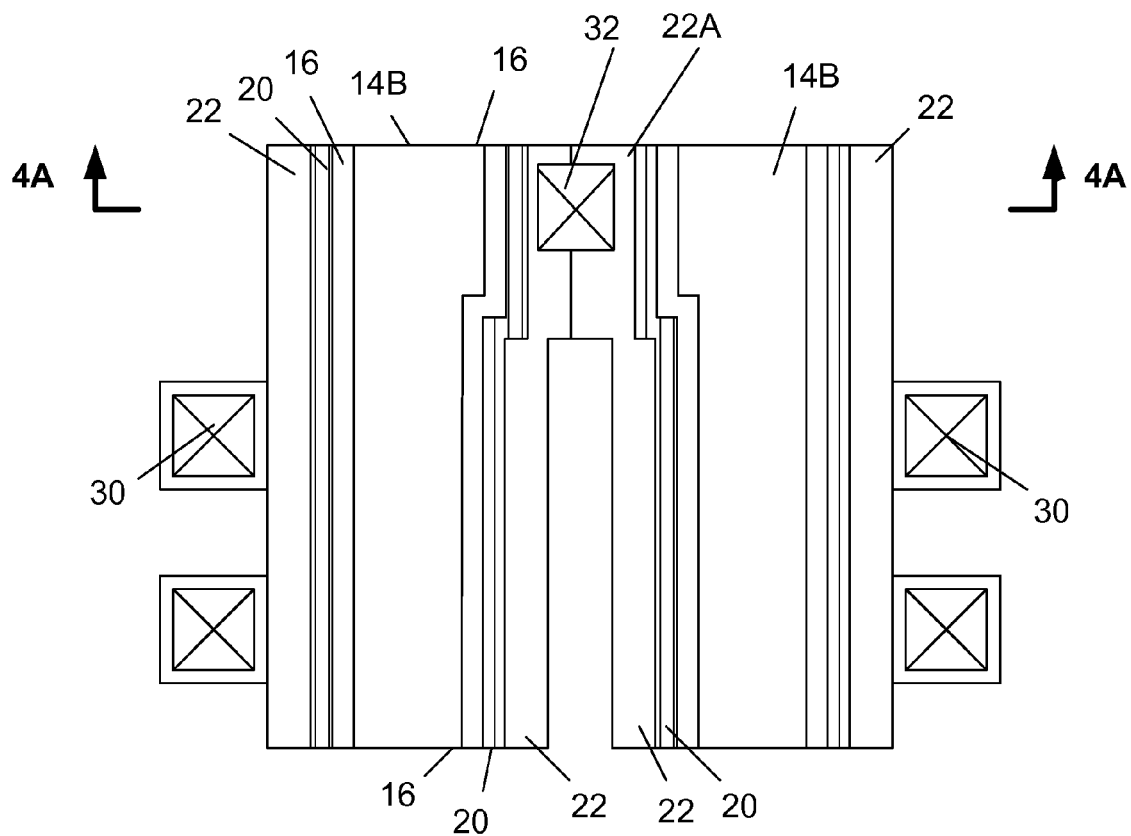

FIGS. 4A-4B depict yet another illustrative technique is employed to provide conductive contacts to the device 100. FIGS. 4A and 4B are, respectively, cross-sectional and plan views of the RRAM device 100. More specifically, in this illustrative embodiment, the width 14W of the gate structures 14 is increased near one end of the gate structures 14 such that the conductive electrode spacers 22 effectively merge into one another. Thereafter, an illustrative spacer electrode contact 32 is conductively coupled to the merged conductive electrode spacers 22. A plurality of conductive source-line contacts 30 are also conductively coupled the source region 31 (a combination of the implant regions 24 and 18) to each of the unit cells 102, 104. However, the source-line contacts 30 and the spacer electrode contact 32 may or may not be in the same plane as illustratively depicted in FIG. 4.

Figure 5:
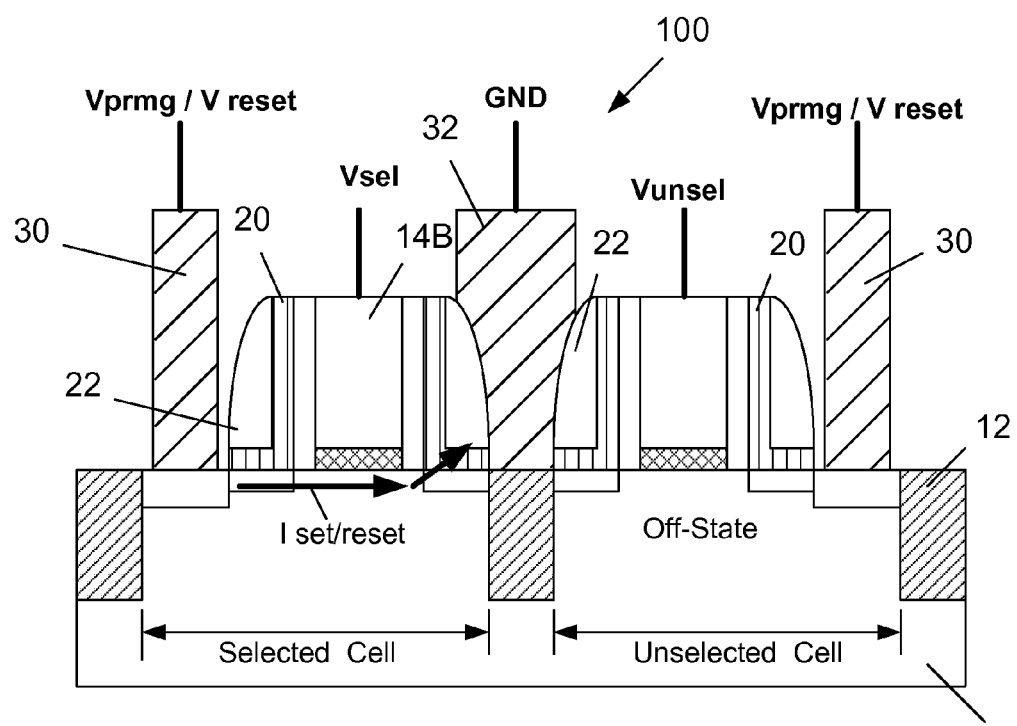
FIG. 5 is a cross-sectional view of one illustrative embodiment of the novel RRAM device disclosed herein.

FIG. 5 is a cross-sectional view of one illustrative embodiment of the RRAM device 100 disclosed herein that will be used to explain various operational aspects of the RRAM device 100. As shown therein, the conductive electrode spacers 22 are coupled to ground or a relatively lower voltage (hereinafter "GND") while either a programming voltage (Vprmg) or a reset voltage (Vreset) may be applied to each of the source-line contacts 30. Initially one of the unit cells is turned "ON" or selected by applying a "select" voltage (Vsel) to the gate electrode 14B, while the other unit cell is turned "OFF" by applying an "unselect" voltage (Vunsel) to the gate electrode 14B of that unit cell. When a unit cell is turned "ON" a current, either a setting current (Iset) or a resetting current (Ireset), depending upon whether the programming voltage (Vprmg) or the reset voltage (Vreset), respectively, is applied to the source-line contact 30, flows from the source region, through the adjustable resistive material 20, through the conductive electrode spacers 22 and to electrical ground.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A RRAM device, comprising:
    a gate electrode;
    a conductive sidewall spacer; and
    at least one variable resistance material layer positioned between said gate electrode and said conductive sidewall spacer wherein at least a portion of said at least one variable resistance material layer is formed on and in contact with a surface of a semiconducting substrate and wherein said portion of said at least one variable resistance material layer is positioned between said substrate and a bottom of said conductive sidewall spacer.

2. The device of claim 1, further comprising a liner layer positioned between said gate electrode and said at least one variable resistance material layer.

3. The device of claim 1, wherein said at least one variable resistance material layer has a generally L-shaped configuration.

4. The device of claim 1, wherein said at least one variable resistance material layer is comprised of at least one of the following materials: a perovskite material, a colossal magnetoresistive (CMR) material, a high temperature superconducting (HTSC) material, $Pr_{.07}Ca_{.03}MnO_3$ (PCMO), $Gd_{0.7}CaO_{0.3}BaCo_2O_{5+5}$, a transition metal oxide, hafnium oxide, titanium oxide, nickel oxide, tungsten oxide, tantalum oxide, copper oxide, a manganite, a titanate, STO:Cr, a zirconate, SZO:Cr, $Ca_2Nb_2O_7$:Cr, $Ta_2O_5$:Cr, a high Tc superconductor and YBCO.

5. The device of claim 1, wherein said conductive sidewall spacer consists of a metal.

6. The device of claim 1, wherein said conductive sidewall spacer is comprised of a variable resistance material.

7. A RRAM device, comprising:
    a gate electrode;
    a conductive sidewall spacer; and
    at least one variable resistance material layer wherein at least a first portion of said at least one variable resistance material layer is positioned between said gate electrode and said conductive sidewall spacer, and wherein a second portion of said at least one variable resistance material layer is formed on and in contact with a surface of a semiconducting substrate, wherein said second portion of said at least one variable resistance material layer is positioned between said substrate and a bottom of said conductive sidewall spacer.

8. The device of claim 7, further comprising a liner layer positioned between said gate electrode and said at least one variable resistance material layer.

9. The device of claim 7, wherein said at least one variable resistance material layer has a generally L-shaped configuration.

10. The device of claim 7, wherein said at least one variable resistance material layer is comprised of at least one of the following materials: a perovskite material, a colossal magnetoresistive (CMR) material, a high temperature superconducting (HTSC) material, $Pr_{0.7}Ca_{.03}MnO_3$ (PCMO), $Gd_{0.7}CaO_{0.3}BaCo_2O_{5+5}$, a transition metal oxide, hafnium oxide, titanium oxide, nickel oxide, tungsten oxide, tantalum oxide, copper oxide, a manganite, a titanate, STO:Cr, a zirconate, SZO:Cr, $Ca_2Nb_2O_7$:Cr, $Ta_2O_5$:Cr, a high Tc superconductor and YBCO.

11. A RRAM device, comprising:
    a first unit cell and a second unit cell formed in and above a semiconducting substrate, wherein each of said unit cells comprises:
        a gate electrode;
        a conductive sidewall spacer; and
        at least one variable resistance material layer positioned between said gate electrode and said conductive sidewall spacer;
    an isolation structure positioned at least partially in said substrate, said isolation structure electrically isolating said first and second unit cells; and
    at least one conductive contact that is physically and conductively coupled to said conductive sidewall spacer on said first unit cell and said conductive sidewall spacer on said second unit cell.

12. The device of claim 11, wherein said conductive sidewall spacer on said first unit cell and said conductive sidewall spacer on said second unit cell are formed such that they physically and conductively contact one another at a contact region.

13. The device of claim 11, further comprising a conductive contact structure that is physically and conductively coupled to said conductive sidewall spacer on said first unit cell and said conductive sidewall spacer on said second unit cell, said conductive contact structure being comprised of the same material as said conductive sidewall spacers.

14. The device of claim 11 wherein said at least one conductive contact is a contact to electrical ground or a relatively low voltage.

15. A RRAM device, comprising:
    a gate electrode;
    a sidewall spacer consisting of a variable resistance material; and
    at least one conductive contact that is physically and conductively coupled to said sidewall spacer.

16. The device of claim 15, further comprising a liner layer positioned between said gate electrode and said sidewall spacer.

17. The device of claim 15, wherein said variable resistance material is comprised of at least one of the following materials: a perovskite material, a colossal magnetoresistive (CMR) material, a high temperature superconducting (HTSC) material, $Pr_{0.7}Ca_{.03}MnO_3$ (PCMO), $Gd_{0.7}CaO_{0.3}BaCo_2O_{5+5}$, a transition metal oxide, hafnium oxide, titanium oxide, nickel oxide, tungsten oxide, tantalum oxide, copper oxide, a manganite, a titanate, STO:Cr, a zirconate, SZO:Cr, $Ca_2Nb_2O_7$:Cr, $Ta_2O_5$:Cr, a high Tc superconductor and YBCO.

18. The device of claim 15, wherein a substantially horizontal portion of said sidewall spacer is formed on and in contact with a surface of a semiconducting substrate and a substantially vertical portion of said sidewall spacer is formed on and in contact with said gate electrode.

19. A RRAM device, comprising:
    a first unit cell and a second unit cell formed in and above a semiconducting substrate, wherein each of said unit cells comprises:

a gate electrode; and a sidewall spacer consisting of a variable resistance material;

at least one conductive contact that is physically and conductively coupled to said sidewall spacer in said first unit cell and said sidewall spacer in said second unit cell; and an isolation structure positioned at least partially in said substrate, said isolation structure electrically isolating said first and second unit cells.

20. The device of claim 19, wherein said sidewall spacers in said first and second unit cells are formed such that they contact one another at a contact region.

21. The device of claim 19, wherein said at least one conductive contact is a contact to electrical ground or a relatively low voltage.

22. A RRAM device, comprising:

a first unit cell and a second unit cell formed in and above a semiconducting substrate, wherein each of said unit cells comprises:

a gate electrode;

a conductive sidewall spacer;

at least one variable resistance material layer positioned between said gate electrode and said conductive sidewall spacer; and an isolation structure positioned at least partially in said substrate, said isolation structure electrically isolating said first and second unit cells, wherein said conductive sidewall spacer on said first unit cell and said conductive sidewall spacer on said second unit cell are formed such that they physically and conductively contact one another at a contact region.

23. A RRAM device, comprising:

a first unit cell and a second unit cell formed in and above a semiconducting substrate, wherein each of said unit cells comprises:

a gate electrode;

a conductive sidewall spacer;

at least one variable resistance material layer positioned between said gate electrode and said conductive sidewall spacer;

an isolation structure positioned at least partially in said substrate, said isolation structure electrically isolating said first and second unit cells; and a conductive contact structure that is physically and conductively coupled to said conductive sidewall spacer on said first unit cell and said conductive sidewall spacer on said second unit cell, said conductive contact structure being comprised of the same material as said conductive sidewall spacers.

* * * * *